United States Patent
Damgaard et al.

(10) Patent No.: US 6,952,569 B2
(45) Date of Patent: *Oct. 4, 2005

(54) WIRELESS TRANSMITTER HAVING A MODIFIED TRANSLATION LOOP ARCHITECTURE

(75) Inventors: Morten Damgaard, Laguna Hills, CA (US); Rahul Magoon, Irvine, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 129 days.

This patent is subject to a terminal disclaimer.

(21) Appl. No.: 10/370,585

(22) Filed: Feb. 24, 2003

(65) Prior Publication Data

US 2003/0139148 A1 Jul. 24, 2003

Related U.S. Application Data

(63) Continuation of application No. 09/398,911, filed on Sep. 14, 1999, now Pat. No. 6,526,265.

(51) Int. Cl.[7] .................................................. H03D 3/29
(52) U.S. Cl. ........................ 455/118; 455/91; 455/95; 455/112; 331/4; 375/354; 375/376
(58) Field of Search ...................... 455/118, 76, 91–117, 455/259–265, 86–87, 313–316, 318–319, 323, 165.1, 75; 331/2–4, 16–18, 14, 23–27, 34, 35–39; 332/107, 123–128; 327/156–157; 375/374–376, 303, 272, 295, 354, 327, 296, 285

(56) References Cited

U.S. PATENT DOCUMENTS

| 4,937,536 A | 6/1990 | Reinhardt et al. ............. 331/8 |
| 5,353,311 A | 10/1994 | Hirata et al. .................... 375/1 |
| 5,682,605 A | 10/1997 | Salter ........................ 455/54.1 |
| 5,828,955 A | 10/1998 | Lipowski et al. ............ 455/324 |
| 5,940,457 A | 8/1999 | Dreifuss et al. ............. 375/376 |
| 6,011,815 A | 1/2000 | Eriksson et al. ............. 375/296 |
| 6,094,101 A | 7/2000 | Sander et al. ................... 331/17 |
| 6,345,173 B1 | 2/2002 | Fourtet et al. ................. 455/76 |
| 6,650,875 B1 * | 11/2003 | Rozenblit et al. ............. 455/91 |
| 6,658,065 B1 * | 12/2003 | Della Torre et al. ......... 375/296 |

FOREIGN PATENT DOCUMENTS

| EP | 0 905 878 A2 | 3/1999 |
| GB | 2 247 368 | 2/1992 |

OTHER PUBLICATIONS

Tham et al., A 2.7V 900MHz/1.9GHz Dual–Band Transceiver IC for Digital Wireless Communication, May 11, 1998, pp. 559–562.

* cited by examiner

*Primary Examiner*—Pablo N. Tran
(74) *Attorney, Agent, or Firm*—William J. Kolegraff

(57) ABSTRACT

A transmitter for a wireless handset having a modified translation loop architecture. The transmitter includes a VCO that generates a modulated transmit signal having a frequency $f_{Tx}$, and a modulated signal source that generates a modulated LO signal with a frequency $f_{LO}$. A mixer mixes the transmit signal with the LO signal to produce an IF signal having a frequency $f_{IF}$. A first divider divides the LO signal frequency $f_{LO}$ by an integer M to generate a first comparison signal having a frequency $f_{CF}$. A second divider divides the IF signal frequency $f_{IF}$, after it is multiplied by an integer K, by an integer N to generate a second comparison signal having a frequency $f_{CF}$. The transmit and LO signal frequencies have the relationship $$f_{Tx} = f_{LO}\frac{KM \pm N}{M}.$$

A phase detector coupled to the first and second comparison signals compares the phases of the signals and outputs a control voltage to the VCO proportional to any phase differences between the signals.

12 Claims, 11 Drawing Sheets

WIRELESS TRANSMITTER HAVING A MODIFIED TRANSLATION LOOP ARCHITECTURE

This application is a continuation of 09/398,911 filed Sep. 14, 1999 now U.S. Pat. No. 6,526,265.

FIELD OF THE INVENTION

The present invention relates generally to radio or wireless communications and, more particularly, relates to a transmitter having a modified translation loop architecture.

BACKGROUND OF THE INVENTION

Wireless or radio frequency (RF) communication systems are an integral component of the ongoing technology revolution and are evolving at an exponential rate. Many wireless communication systems are configured as "cellular" systems, in which the geographic area to be covered by the cellular system is divided into a plurality of "cells". Mobile communication devices or stations (e.g., wireless telephones, pagers, personal communications devices and the like) in the coverage area of a cell communicate with a fixed base station or transmitter within the cell. Low power base stations are utilized, so that frequencies used in one cell can be re-used in cells that are sufficiently distant to avoid interference. Hence, a cellular telephone user, whether mired in traffic gridlock or attending a meeting, can transmit and receive phone calls so long as the user is within a cell served by a base station.

The communication format used in most wireless communications systems is a high-frequency carrier waveform modulated by low frequency or "baseband" audio or data signals. Mobile stations (wireless handsets, for example) within a wireless communication system typically have a transmitter that "modulates" baseband signals (e.g., speech detected by the handset microphone) onto the carrier waveform. Amplitude modulation (AM) and frequency modulation (FM) techniques, for example, are well known to those of ordinary skill in the art. Mobile stations also typically have a receiver that "demodulates" the carrier waveform to extract the baseband signal.

The carrier waveform that is modulated is usually a high frequency, periodic waveform generated by an oscillator. The frequency of the oscillator should be adjustable since the transmitter is often required to transmit on many different frequency channels within a transmission band. In a GSM wireless network, for example, the transmission band is 880–915 MHz and is divided into 200 kHz channels. Thus, the oscillator frequency must be varied in precise steps of 200 kHz. Voltage-controlled oscillators (VCOs) are well suited for such applications since their output frequency is easily adjusted by manipulating a control voltage.

Many transmitters use phase-locked loops (PLLs) to generate the desired range of frequencies. The design and operation of PLLs is well known to those of ordinary skill in the art. A basic PLL 10 is illustrated in FIG. 1. It includes a VCO 16 that outputs a signal having a frequency $f_{Tx}$ within a defined transmission frequency band. PLL 10 also uses a reference or clock signal having a frequency $f_{REF}$ equal to the required step size or frequency resolution (e.g., the channel bandwidth) of the PLL. Each frequency channel (e.g., 900 MHz, 900.2 MHz, 900.4 MHz) is an exact integer multiple of the reference frequency (e.g., 0.2 MHz). VCO 16 locks to the reference signal and tracks any modulation contained in the reference signal (to the extent that it is passed through the loop filter).

Frequency divider 18 divides the frequency of the VCO output signal by an integer N to yield a signal having the same frequency as the reference frequency, $$f_{REF} = \frac{f_{Tx}}{N}.$$

The divided frequency and reference frequency signals are input to phase detector 12, which compares the phases of the two signals and outputs a control voltage to control the frequency of the VCO. The output from phase detector 12 is usually passed through a charge pump/loop filter (14) before being supplied to VCO 16. Hence, the output frequency of VCO 16 can be programmed in discrete steps by changing the value of divider N. Passing the reference frequency through a reference divider (not shown), thereby making the step size programmable, can provide additional flexibility.

Some wireless transmitters use a translation loop architecture that is very similar in concept and operation to a PLL architecture. An exemplary translation loop transmitter 200 is illustrated in FIG. 6. Transmitter 200 will be discussed briefly for now and in more detail in the description to follow. In a translation loop transmitter, modulation is typically performed by a quadrature mixer (202) that modulates baseband audio and/or data signals onto a carrier wave at an intermediate frequency (IF) generated by a local oscillator (LO1). The IF frequency is also used as the reference input to a phase detector (204). The frequency of the modulated VCO (210) output signal is down-converted to the IF frequency for phase comparison by mixing the VCO signal (mixer 212) with a signal generated by a second local oscillator (LO2).

Translation loop transmitters have several drawbacks. Frequency mixers generate various cross products of the local oscillator signals and their harmonics. Spurious mixing products can also be created through leakage of local oscillator signals. In FIG. 6, for example, the signal from oscillator LO1 may leak to oscillator LO2, and vice-versa, to generate mixing products. Though filters are employed to remove these mixing products, low frequency products ("zero crossing" spurs) may not be attenuated by the filters and may cause corruption and spurious modulation of the VCO transmit signal. Additionally, translation loop transmitters generally require use of a quadrature mixer or modulator, which increases the required circuitry and decreases the cost efficiency of the transmitter.

SUMMARY OF THE INVENTION

The present invention provides a modified translation loop transmitter that improves on conventional translation loop transmitters. The transmitter has a VCO and one modulated signal source. Elimination of the multiple local oscillators used by prior art transmitters is cost-effective and reduces the occurrence of low frequency mixing product spurs. Moreover, the VCO transmit frequency is a multiple of the modulated signal source frequency, and is easily programmable to a particular frequency channel through the setting of the modulated signal (LO) frequency, or by changing the divider and multiplier factors, which are integers. Using a modulated signal source also eliminates the need for a quadrature mixer, which further reduces the cost and circuitry required.

In one embodiment of the present invention, a transmitter is provided. The transmitter comprises a voltage-controlled oscillator (VCO) that generates a transmit signal having a frequency $f_{Tx}$, and a modulated signal source that generates an LO signal having a frequency $f_{LO}$ modulated with audio or data information. The transmitter further comprises a mixer that mixes the transmit signal with the LO signal to produce an IF signal having a frequency $f_{IF}$. A first divider divides the LO signal frequency $f_{LO}$ by an integer M to generate a first comparison signal having a frequency $f_{CF}$, and a second divider divides the IF signal frequency $f_{IF}$ by an integer N to generate a second comparison signal also having a frequency $f_{CF}$. The first and second comparison signals are supplied to a phase detector that compares the phases of the signals and outputs a control voltage to the VCO proportional to any phase differences between the signals.

In one implementation, the modulated signal source is a direct digital synthesizer (DDS) or a sigma-delta synthesizer. In a further implementation, a multiplier is provided that multiplies the LO signal by an integer K before the LO signal is supplied to the mixer. In this implementation, when $f_{LO} > f_{Tx}$, the relationship between the transmit and LO signal frequency is expressed as $$f_{Tx} = f_{LO} \frac{KM - N}{M},$$

and when $f_{LO} < f_{Tx}$, the relationship between the transmit and LO signal frequency is expressed as $$f_{Tx} = f_{LO} \frac{KM + N}{M}.$$

In another embodiment of the present invention, a wireless communication device is provided. The wireless communication device comprises a processor that directs the overall operation of the communication device. It further comprises a microphone for capturing audio acoustic signals and converting the acoustic signals into electric signals, a speaker for converting electric signals into audible acoustic signals, and an antenna for wireless transmission and reception of acoustic or data signals.

A receiver is provided for receiving audio or data information from the antenna and a transmitter is provided for transmitting audio or data information over the antenna. The transmitter has a modified translation loop architecture and comprises a voltage-controlled oscillator (VCO) that generates a transmit signal having a frequency $f_{Tx}$, and a modulated signal source that generates an LO signal having a frequency $f_{LO}$ that is modulated with audio or data information. The transmitter further comprises a mixer that mixes the transmit signal with the LO signal to produce an IF signal having a frequency $f_{IF}$. A first divider divides the LO signal frequency $f_{LO}$ by an integer M to generate a first comparison signal having a frequency $f_{CF}$, and a second divider divides the IF signal frequency $f_{IF}$ by an integer N to generate a second comparison signal also having a frequency $f_{CF}$. The first and second comparison signals are supplied to a phase detector that compares the phases of the signals and outputs a control voltage to the VCO proportional to any phase differences between the signals.

The present invention also provides a method for transmitting a modulated transmit signal. The method comprises the following steps:

(a) generating a modulated LO signal having a frequency $f_{LO}$;

(b) generating a modulated transmit signal having a frequency $f_{Tx} = f_{LO} \cdot y$;

(c) dividing the frequency $f_{LO}$ of the LO signal by an integer M to generate a first comparison signal;

(d) mixing the LO signal with the transmit signal to generate an IF signal;

(e) dividing the frequency of the IF signal by an integer N to generate a second comparison signal;

(f) comparing the phases of the first and second comparison signals; and (g) adjusting the frequency $f_{Tx}$ of the transmit signal if necessary to correct any phase differences between the first and second comparison signals.

In another embodiment of the present invention, a method is provided for selecting a transmit frequency channel $f_{Tx}$. The method comprises the following steps:

(a) selecting an initial transmit frequency channel $f_{Tx}$;

(b) providing a multiplication factor y;

(c) selecting an LO signal having a frequency $f_{LO}$ such that $f_{Tx} = f_{LO} \cdot y$;

(d) generating a transmit signal on the frequency channel $f_{Tx}$; and (e) repeating step (c) to change the frequency channel, and repeating step (d) to keep the same frequency channel.

Objects and advantages of the present invention include any of the foregoing, singly or in combination. Further objects and advantages will be apparent to those of ordinary skill in the art, or will be set forth in the following disclosure.

BRIEF DESCRIPTION OF THE DRAWINGS

The present invention is described with reference to the accompanying drawings. In the drawings, like reference numbers indicate identical or functionally similar elements.

DETAILED DESCRIPTION OF PREFERRED EMBODIMENTS

1. Example Wireless Communication Network

Figure 1:
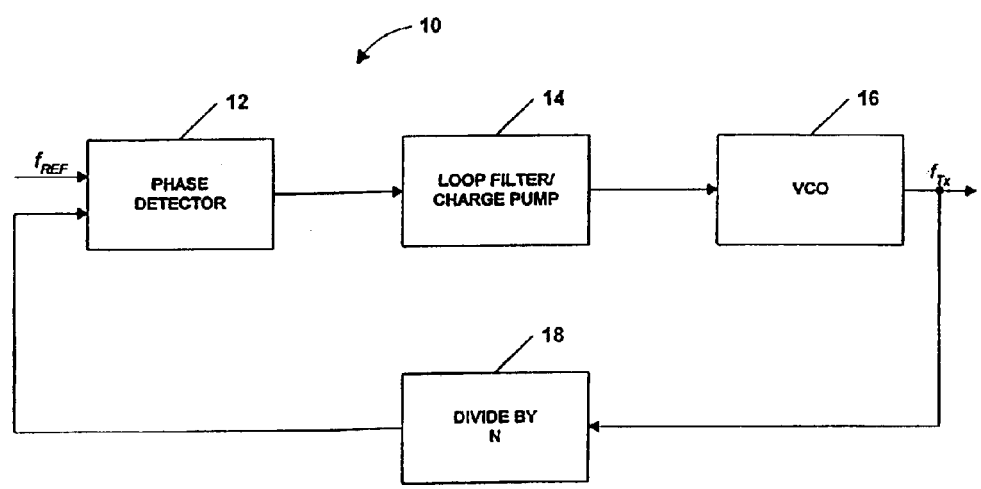
FIG. 1 is a block diagram of a phase-locked loop.

Before describing the invention in detail, it is useful to describe an example environment in which the invention can be implemented. One such example is a wireless communication network. For illustrative purposes, the present invention will be described in the context of a wireless communication network adhering to the GSM standard. It should be understood, however, that the present invention could also be implemented in the context of other wireless communication networks.

One of the most common forms of wireless communications networks, mobile cellular systems, were originally developed as analog systems. After their introduction for commercial use in the early 1980s, mobile cellular systems began to experience rapid and uncoordinated growth. In Europe, for example, individual countries developed their own systems. Generally, the systems of individual countries were incompatible, which constricted mobile communications within national boundaries and restricted the market for mobile equipment developed for a particular country's system.

In 1982, in order to address this growing problem, the Conference of European Posts and Telecommunications (CEPT) formed the Groupe Spéciale Mobile (GSM) to study and develop a set of common standards for a future pan-European cellular network. It was recommended that two blocks of frequencies in the 900 MHz range be set aside for the system. The initial goals for the new system included international roaming ability, good subjective voice quality, compatibility with other systems such as the Integrated Services Digital Network (ISDN), spectral efficiency, low handset and base station costs, and the ability to support new services and a high volume of users.

One of the initial, major decisions in the development of the GSM standard was adoption of a digital, rather than an analog, system. As mentioned above, analog systems were experiencing rapid growth and the increasing demand was straining the capacity of the available frequency bands. Digital systems offer improved spectral efficiency and are more cost-efficient. The quality of digital transmission is also superior to that of analog transmission. Background sounds such as hissing and static and degrading effects such as fadeout and cross talk are largely eliminated in digital systems. Security features such as encryption are more easily implemented in a digital system. Compatibility with the ISDN is more easily achieved with a digital system. Finally, a digital approach permits the use of Very Large Scale Integration (VLSI), thereby facilitating the development of cheaper and smaller mobile handsets.

In 1989, the European Telecommunications Standards Institute (ETSI) took over responsibility for the GSM standards. In 1990, phase I of the standard was published and the first commercial services employing the GSM standard were launched in 1991. It was also renamed in 1991 as the Global System for Mobile Communications (still GSM). After its early introduction in Europe, the standard was elevated to a global stage in 1992 when introduced in Australia. Since then, GSM has become the most widely adopted and fastest growing digital cellular standard, and is positioned to become the world's dominant cellular standard. With (currently) 324 GSM networks in operation in 129 countries, GSM provides almost complete global coverage. As of January 1999, according to the GSM Memorandum of Understanding Association, GSM accounted for more than 120 million subscribers. Market research firms estimate that by 2001, there will be more than 250 million GSM subscribers worldwide. At that time, GSM will account for almost 60% of the global cellular subscriber base, with yearly shipments exceeding 100 million phones.

Figure 2A:
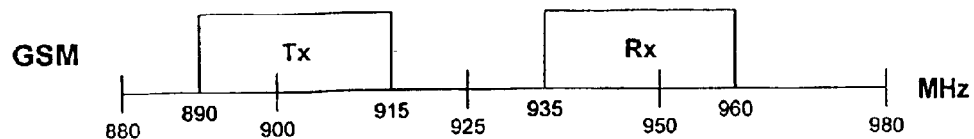
FIG. 2a illustrates the transmit and receive frequency bands under the GSM standard.
Figure 2B:
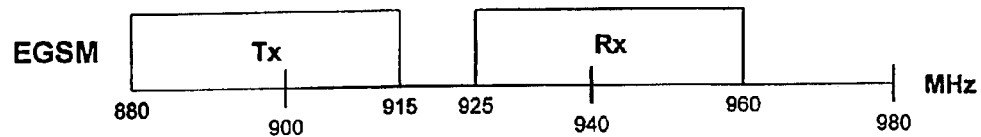
FIG. 2b illustrates the transmit and receive frequency bands under the EGSM standard.

Two frequency bands of 25 MHz were allocated for GSM use. As illustrated in FIG. 2a, the 890–915 MHz band is reserved for transmission or "uplink" (mobile station to base station), and the 935–960 MHz band is reserved for reception or "downlink" (base station to mobile station). An extra ten MHz of bandwidth was later added to each frequency band. The standard incorporating this extra bandwidth (two 35 MHz bands) is known as Extended GSM (EGSM). In EGSM, the transmission band covers 880–915 MHz and the receiving band covers 925–960 MHz (FIG. 2b). The terms GSM and EGSM are used interchangeably, with GSM sometimes used in reference to the extended bandwidth portions (880–890 MHz and 925–935 MHz). Sometimes, the originally specified 890–915 MHz and 935–960 MHz bands are designated Primary GSM (PGSM). In the following description, GSM will be used in reference to the extended bandwidth (35 MHz) standard.

Figure 2C:
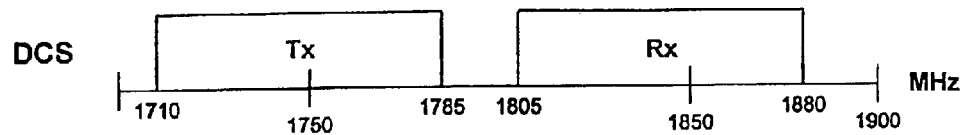
FIG. 2c illustrates the transmit and receive frequency bands under the GSM 1800 ("DCS") standard.
Figure 2D:
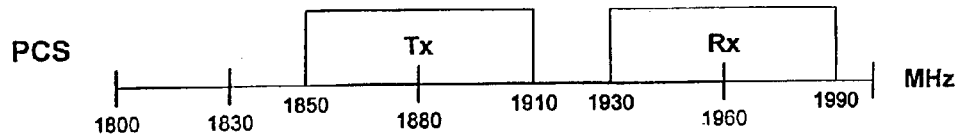
FIG. 2d illustrates the transmit and receive frequency bands under the GSM 1900 ("PCS") standard.

Due to the expected widespread use of GSM, capacity problems in the 900 MHz frequency bands were anticipated and addressed. ETSI had already defined an 1800 MHz variant (DCS or GSM 1800) in the first release of the GSM standard in 1989. In DCS, the transmission band covers 1710–1785 MHz and the receiving band covers 1805–1880 MHz (FIG. 2c). In the United States, the Federal Communications Commission (FCC) auctioned large blocks of spectrum in the 1900 MHz band, aiming to introduce digital wireless networks to the country in the form of a mass market Personal Communication Service (PCS). The GSM service in the US is known as PCS or GSM 1900. In PCS, the transmission band covers 1850–1910 MHz and the receiving band covers 1930–1990 MHz (FIG. 2d).

Regardless of which GSM standard is used, once a mobile station is assigned a channel, a fixed frequency relation is maintained between the transmit and receive frequency bands. In GSM (900 MHz), this fixed frequency relation is 45 MHz. If, for example, a mobile station is assigned a transmit channel at 895.2 MHz, its receive channel will always be at 940.2 MHz. This also holds true for DCS and PCS; the frequency relation is just different. In DCS, the receive channel is always 95 MHz higher than the transmit channel and, in PCS, the receive channel is 80 MHz higher than the transmit channel.

Figure 3:
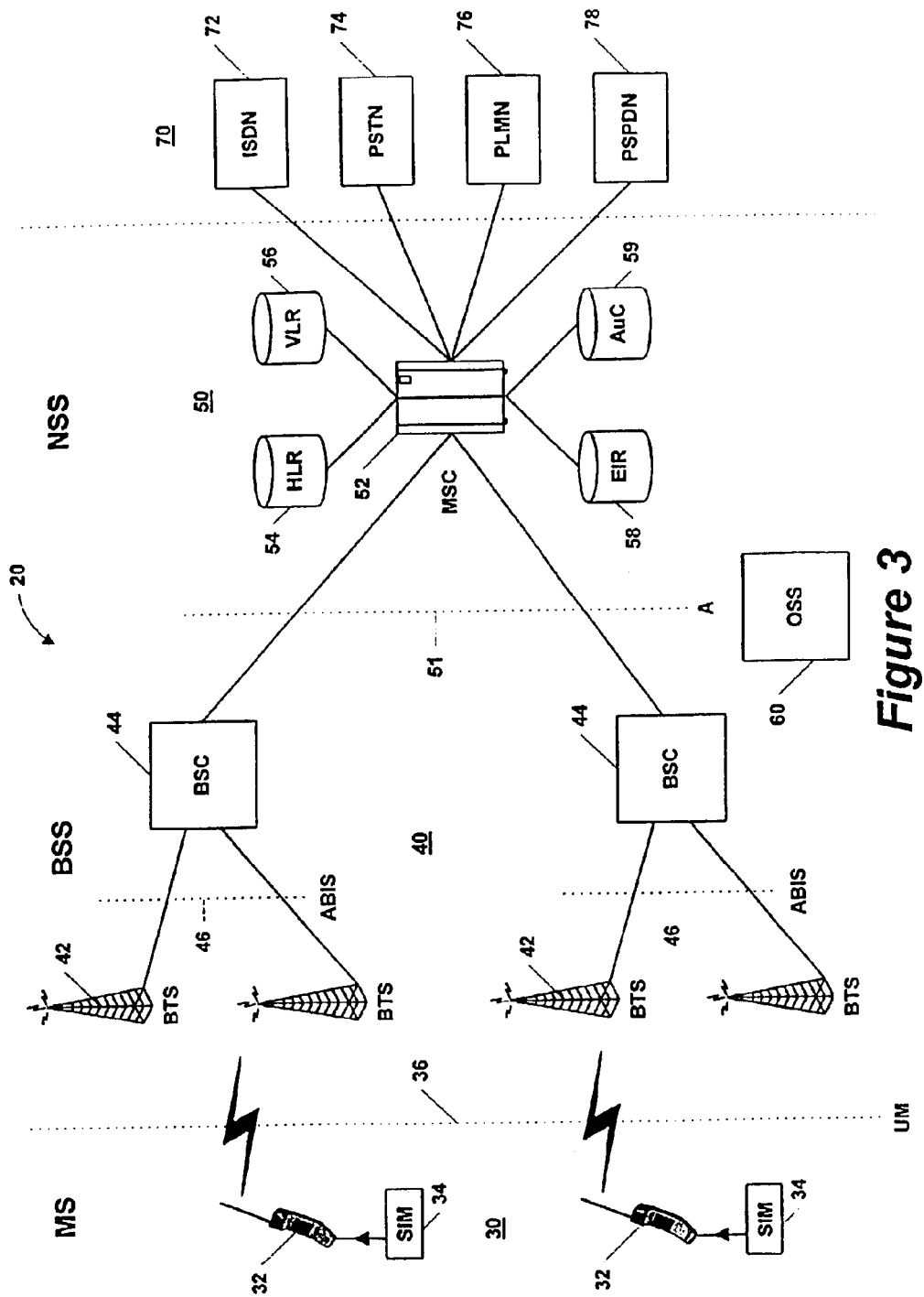
FIG. 3 is a block diagram of an exemplary GSM network.

The architecture of one implementation of a GSM network 20 is depicted in block form in FIG. 3. GSM network 20 is divided into four interconnected components or subsystems: a Mobile Station (MS) 30, a Base Station Subsystem (BSS) 40, a Network Switching Subsystem (NSS) 50 and an Operation Support Subsystem (OSS) 60. Generally, MS 30 is the mobile equipment or phone carried by the user; BSS 40 interfaces with multiple MSs 30 and manages the radio transmission paths between the MSs and NSS 50; NSS 50 manages system switching functions and facilitates communications with other networks such as the PSTN and the ISDN; and OSS 60 facilitates operation and maintenance of the GSM network.

Mobile Station 30 comprises Mobile Equipment (ME) 32 and Subscriber Identity Module (SIM) 34. ME 32 is typically a digital mobile phone or handset. SIM 34 is a memory device that stores subscriber and handset identification information. It is implemented as a smart card or as a plug-in module and activates service from any GSM phone. Among the information stored on SIM 34 are a unique International Mobile Subscriber Identity (IMSI) that identifies the subscriber to system 20, and an International Mobile Equipment Identity (IMEI) that uniquely identifies the mobile equipment. A user can access the GSM network via any GSM handset, or terminal through use of the SIM. Other information, such as a personal identification number (PIN) and billing information, may be stored on SIM 34.

MS 30 communicates with BSS 40 across a standardized "Um" or radio air interface 36. BSS 40 comprises multiple base transceiver stations (BTS) 42 and base station controllers (BSC) 44. A BTS is usually in the center of a cell and consists of one or more radio transceivers with an antenna. It establishes radio links and handles radio communications over the Um interface with mobile stations within the cell. The transmitting power of the BTS defines the size of the cell. Each BSC 44 manages multiple, as many as hundreds of, BTSs 42. BTS-BSC communication is over a standardized "Abis" interface 46, which is specified by GSM to be standardized for all manufacturers. The BSC allocates and manages radio channels and controls handovers of calls between its BTSs.

The BSCs of BSS 40 communicate with network subsystem 50 over a GSM standardized "A" interface 51. The A interface uses an SS7 protocol and allows use of base stations and switching equipment made by different manufacturers. Mobile Switching Center (MSC) 52 is the primary component of NSS 50. MSC 52 manages communications between mobile subscribers and between mobile subscribers and public networks 70. Examples of public networks 70 that MSC 52 may interface with include Integrated Services Digital Network (ISDN) 72, Public Switched Telephone Network (PSTN) 74, Public Land Mobile Network (PLMN) 76 and Packet Switched Public Data Network (PSPDN) 78.

MSC 52 interfaces with four databases to manage communication and switching functions. Home Location Register (HLR) 54 contains details on each subscriber residing within the area served by the MSC, including subscriber identities, services to which they have access, and their current location within the network. Visitor Location Register (VLR) 56 temporarily stores data about roaming subscribers within a coverage area of a particular MSC. Equipment Identity Register (EIR) 58 contains a list of mobile equipment, each of which is identified by an IMEI, which is valid and authorized to use the network. Equipment that has been reported as lost or stolen is stored on a separate list of invalid equipment that allows identification of subscribers attempting to use such equipment. The Authorization Center (AuC) 59 stores authentication and encyrption data and parameters that verify a subscriber's identity.

OSS 60 contains one or several Operation Maintenance Centers (OMC) that monitor and maintain the performance of all components of the GSM network. OSS 60 maintains all hardware and network operations, manages charging and billing operations and manages all mobile equipment within the system.

Figure 4:
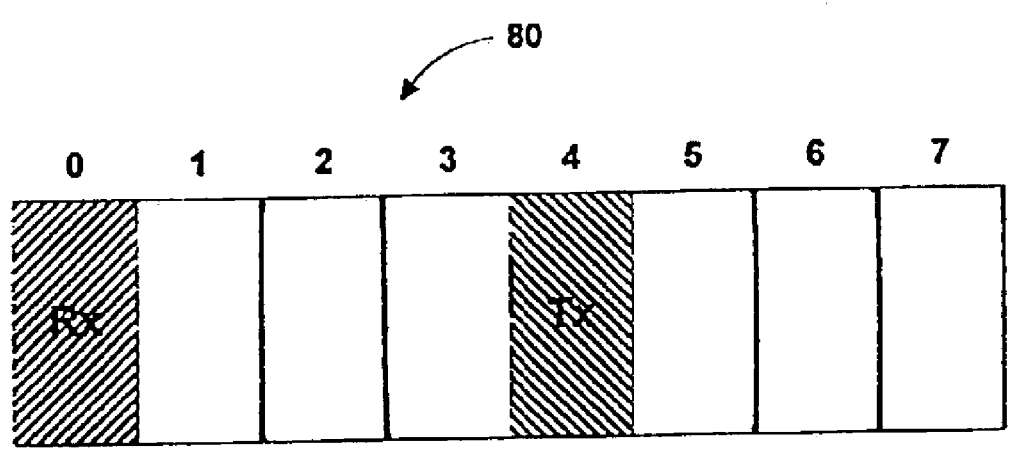
FIG. 4 illustrates the format of a conventional TDMA frame.

The available radio channels or bands are distributed among the base transceiver stations according to a frequency plan. In a GSM network, the transmitting and receiving bands are divided into 200 kHz carrier frequency channels. To increase system capacity, a Time Division Multiple Access (TDMA) frame structure is used to subdivide each of the carrier channels in time into multiple time slots. Each time slot has a duration of approximately 0.577 ms, and eight time slots form a TDMA "frame", having a duration of 4.615 ms. One implementation of a conventional TDMA frame 80 having eight time slots 0–7 is illustrated in FIG. 4.

In this conventional TDMA framework, each mobile station is assigned one time slot for receiving data and one time slot for transmitting data. In TDMA frame 80, for example, time slot zero has been assigned to receive data and time slot four has been assigned to transmit data. It is conventional to refer to both the transmit and receive slots as the same time slot (i.e., time slot zero), but being offset by a fixed time interval (typically 2.5 to 3 slots). The remaining slots are used for offset, control, monitoring and other operations. This framework permits simultaneous reception by as many as eight mobile stations on one frequency and simultaneous transmission by as many as eight mobile stations on one frequency.

2. Example Wireless Communication Device

The transmitter of the present invention may be implemented in a wide number of wireless communication devices having various configurations and architectures. Though the present invention is not dependent on a particular device or handset architecture, in order to provide a framework for the present invention, an example wireless handset is described with reference to FIG. 5.

Figure 5:
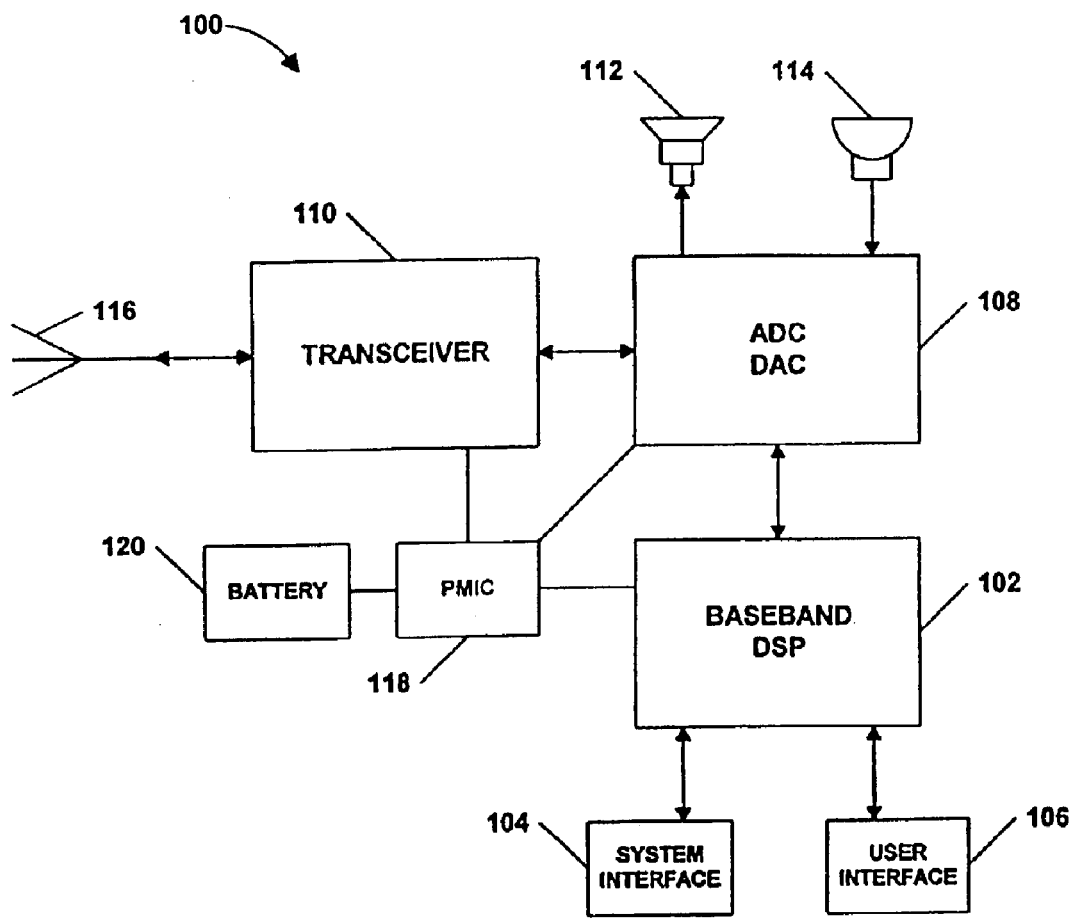
FIG. 5 is a block diagram of a mobile station according to the present invention.

FIG. 5 is a block diagram of one implementation of a wireless communication device 100 incorporating a transmitter according to the present invention. Device 100 may be a mobile handset, an automobile phone, or any other wireless communication device. For illustrative purposes only, device 100 will be discussed in the context of a wireless handset. Handset 100 may operate as a mobile station within a GSM network, such as a mobile station 30 within a GSM network 20 as illustrated in FIG. 3.

Handset 100 includes a processor 102, such as a baseband digital signal processor (DSP), typically integrated on a single die. Processor 102 directs the overall operation of handset 100 and is ordinarily programmed or coded with a computer program or routine to enable it to carry out its operations. In one implementation, processor 102 is housed in a 128-pin TQFP and, in another implementation, processor 102 is housed in a 160-pin 12×12 mm Chip Array Ball Grid Array (CABGA).

Handset 100 also includes a transceiver 110. Transceiver 110 is configured with a transmitter for transmitting audio and/or data information, and a receiver for receiving audio and/or data information. Processor 102 processes audio data received from antenna 116 and transceiver 110 into an audible acoustic signal for announcement over speaker 112. Processor 102 also processes acoustic data received from microphone 114 into baseband data that is provided to transceiver 110 for transmission over antenna 116.

Processor 102 also manages system and user interface tasks via a system interface 104 and a user interface 106. System interface 104 may include suitable means for managing functions such as GSM network, modem access and other subscriber services. User interface 106 may include suitable means for inputting and displaying information, such as a keypad, display, backlight, volume control and real time clock.

In one implementation, processor 102 interfaces with transceiver 110, speaker 112 and microphone 114 via integrated analog IC 108. IC 108 implements an analog-to-digital converter (ADC), a digital-to-analog converter (DAC) and all signal conversions required to permit interface between processor 102 and transceiver 110, speaker 112 and microphone 114. Typically, the ADC and DAC will be embodied in a CODEC. IC 108 may be implemented in a 100-pin TQFP, a 100-pin 10×10 mm CABGA package or in any other suitable housing.

Microphone 114 is configured to convert acoustic signals, typically those in the audio band, into analog electric signals. The signals captured by microphone 114 are decoded and digitized by the ADC in IC 108 and processed into baseband I and Q signals by processor 102. The digital baseband I and Q signals are converted into an analog signal stream by the DAC in IC 108, and are then modulated and transmitted (via antenna 116) by transceiver 110. Conversely, modulated signals captured by antenna 116 are demodulated and converted into analog baseband I and Q signals by transceiver 110, digitized by IC 108, processed by processor 102, and converted into an analog acoustic signal by IC 108 that is announced by speaker 112.

A power management IC (PMIC) 118 is coupled to a battery 120 and integrates on a single die all power supply related functions required by handset 100.

3. Example Translation Loop Transmitter

Figure 6:
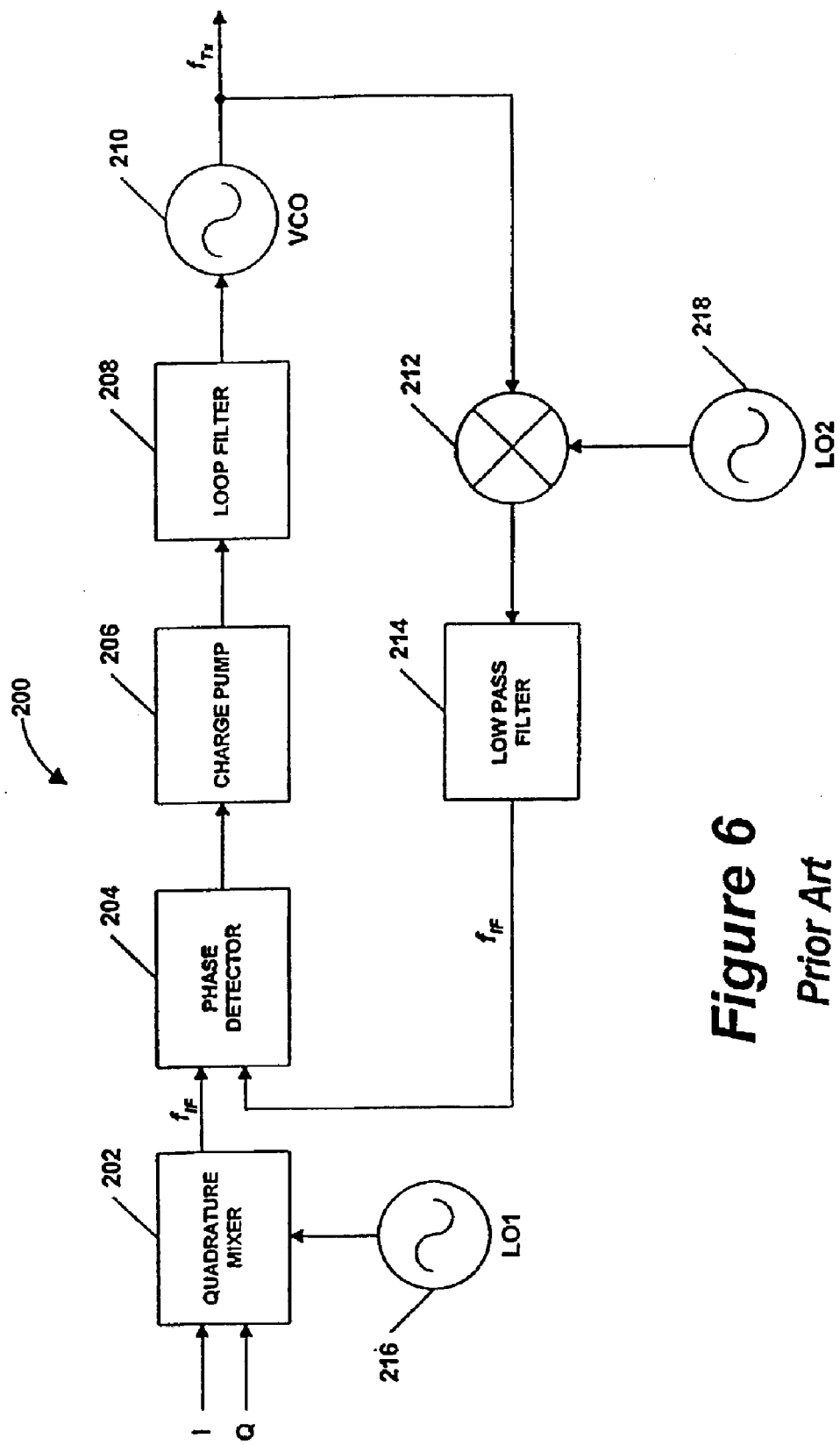
FIG. 6 is a block diagram of a transmitter having a translation loop architecture.

FIG. 6 is a general block diagram of a translation loop transmitter 200. Transmitter 200 is shown and described in order to provide a backdrop for the later discussion of transmitter 300 embodying the present invention. Transmitter 200 is included for exemplary purposes only and without any admission as to its prior art effect. It will ordinarily be embodied in a transceiver of a wireless handset, such as transceiver 110 of FIG. 5. Transmitter 200 comprises quadrature mixer 202, phase detector 204, charge pump 206, loop filter 208, transmit VCO 210, mixer or down converter 212, low pass filter 214, and local oscillators LO1 (216) and LO2 (218).

VCO 210, for GSM operation, has a bandwidth corresponding to the GSM transmit band of 880–915 MHz. For DCS operation, VCO 210 has a bandwidth corresponding to the DCS transmit band of 1710–1785 MHz. For a dual band transmitter, two separate VCOs may be provided, one of which having a GSM-transmit bandwidth and the other having a DCS transmit bandwidth.

VCO 210 outputs a modulated transmit signal that is supplied to antenna 116 (FIG. 5) for wireless transmission. The transmit signal is typically passed through several stages of amplification, filtering and switching before it reaches antenna 116. The VCO output is also supplied to mixer or down converter 212. Down converter 212 produces an IF signal having a frequency $f_{IF}$ by mixing the transmit signal from VCO 210 with a signal from local oscillator LO2. The bandwidth of local oscillator LO2 is typically in the range of 1200–1500 MHz. For GSM operation, down converter 212 operates in "high side injection" mode. That is, the frequency of local oscillator LO2 is higher than that of the transmit signal. In GSM mode, the IF frequency of the signal produced by down converter 212 can be expressed as:

$$f_{IF}=f_{LO1}-f_{Tx}(GSM).$$

For DCS operation, down converter 212 operates in "low side injection" mode; the frequency of oscillator LO2 is lower than that of the transmit signal. In DCS mode, the IF frequency of the signal produced by down converter 212 can be expressed as:

$$f_{IF}=f_{Tx}-f_{LO1}(DCS).$$

The IF signal output by down converter 212 is filtered by low pass filter 214, and is then supplied to one of the inputs of phase detector 204.

Analog voice signals captured by microphone 114, or data signals, are converted to a digital signal stream and processed into baseband "I" and "Q" signals by processor 102 (FIG. 5). The digital baseband "I" and "Q" signals are converted into analog "I" and "Q" signals by DAC 108 and are input to quadrature mixer 202.

Quadrature mixer 202 mixes the "I" and "Q" signals with ninety-degree phase-displaced intermediate frequency (IF) signals from local oscillator LO1 and sums the resulting signals to generate a modulated signal at the IF frequency $f_{IF}$. Typically, oscillator LO1 has an IF frequency range of 350–400 MHz. The modulated IF output of quadrature mixer 202 is supplied to the other of the inputs of phase detector 204. Phase detector 204 adjusts the phase of VCO 270 as necessary to correct any detected phase differences between the signals from down converter 212 and phase detector 202. A modulated signal is output by VCO block 270 to antenna 116 for transmission.

Figure 7:
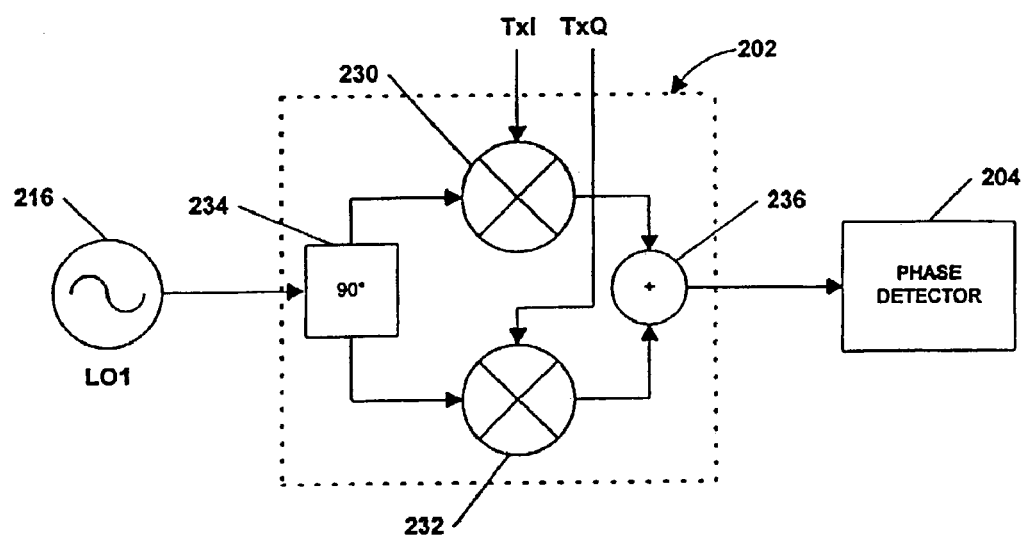
FIG. 7 is a more detailed block diagram of a quadrature mixer which forms a part of the transmitter of FIG. 6.

Quadrature mixer 202 is illustrated in more detail in FIG. 7. It comprises two mixers 230 and 232, a 90°-phase shifter 234 and a summer 236. Phase shifter 234 splits the IF signal from oscillator LO1 into two 90° phase-displaced signals. Mixer or "I" modulator 230 mixes the "I" modulating signal with the 0° IF signal, and mixer or "Q" modulator 232 mixes the "Q" modulating signal with the 90° IF signal. Summer 236 combines the output signals from mixers 230 and 232 to form a modulated IF signal having both "I" and "Q" components.

Phase detector 204 compares the phase of the modulated signal at the intermediate frequency $f_{IF}$ from quadrature mixer 202 with the phase of the modulated signal at the intermediate frequency $f_{IF}$ from low pass filter 214. Based on the comparison of the signal phases, detector 204 generates an appropriate output signal. If the phases of the two signals are aligned, the loop is "locked". No adjustment voltage is asserted and VCO 210 continues to oscillate at the same frequency. If one signal leads or lags the other, phase detector 204 outputs a pulse proportional to the phase difference between the two signals. The output pulses are commonly referred to as "UP" or "DOWN" signals and typically have a width or duration corresponding to any phase difference between the detector input signals.

Charge pump 206, based on the signal received from detector 204, generates a current that adjusts the transmit frequency of VCO 210. The charge pump current is increased or decreased as necessary to correct phase leads or lags. If the loop is locked, the charge pump current is neither increased nor decreased to compensate for phase errors. Loop filter 206 develops a control voltage from the charge pump current and applies it to VCO 210. A common configuration for a loop filter is a simple single-pole, low-pass filter that can be realized with a single resistor and capacitor. VCO 210 oscillates about a specific transmit frequency channel that is adjusted as necessary by the control voltage applied by loop filter 208. The bandwidth of the transmit frequency channel is typically 200 kHz.

The use of two local oscillators LO1 and LO2 can be problematic, as spurious mixing products can be created through leakage of the oscillator signals. The signal from LO1 may leak to oscillator LO2 and generate mixing products, or vice-versa. Though filters 208 and 214 are employed to attenuate such spurious mixing products, low frequency products ("zero crossing" spurs) may not be attenuated by the filters and may cause corruption and spurious modulation of the transmit signal. Additionally, the use of a quadrature mixer or modulator is not always ideal, as it increases the required circuitry and decreases the cost efficiency of the transmitter.

4. Modified Translation Loop Transmitter

Figure 8:
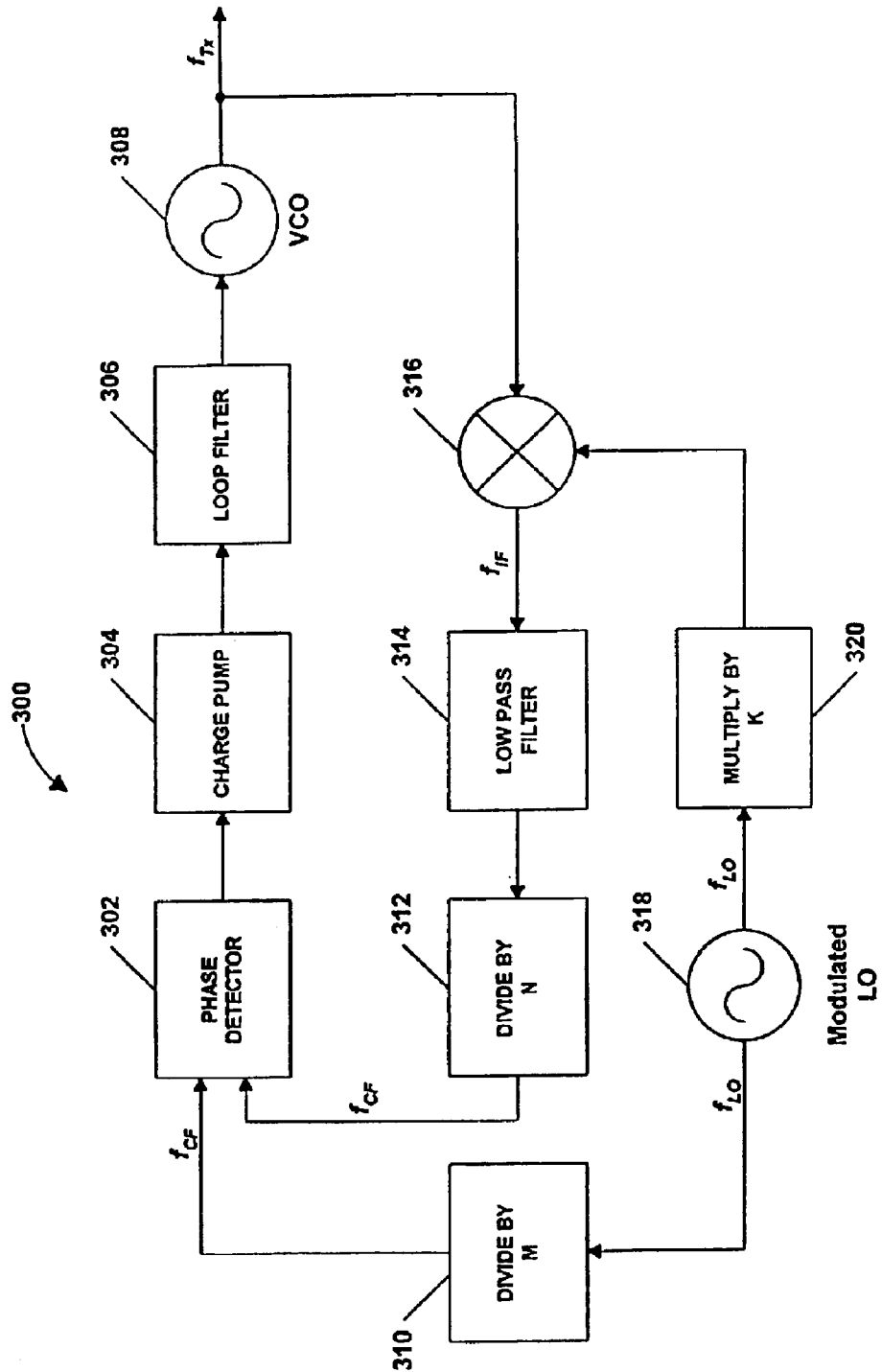
FIG. 8 is a block diagram of a modified translation loop transmitter according to the present invention.

FIG. 8 is a block diagram of a modified translation loop transmitter 300 embodying the present invention. Transmitter 300 comprises phase detector 302, charge pump 304, loop filter 306, transmit VCO 308, dividers 310 and 312, low pass filter 314, mixer or down converter 316, modulated LO signal source 318 and multiplier 320.

VCO 308, for GSM operation, has a frequency range or bandwidth corresponding to the extended GSM transmit band of 880–915 MHz. For DCS operation, VCO 308 has a frequency range corresponding to the DCS transmit band of 1710–1785 MHz. For a dual band transmitter, two separate VCOs may be provided, one of which having a GSM transmit bandwidth and the other having a DCS transmit bandwidth. In a dual band configuration, only one of the VCOs would be active at a time.

VCO 308 outputs a modulated transmit signal at frequency $f_{Tx}$, that is supplied to antenna 116 (FIG. 5) for wireless transmission. The transmit signal is typically passed through several stages of amplification, filtering and switching before it reaches antenna 116. The VCO output is also supplied to mixer or down converter 316. Down converter 316 produces an IF signal having a frequency $f_{IF}$ by mixing the transmit signal from VCO 308 with the modulated LO signal from source 318. The bandwidth of signal source 318 is typically in the range of 450–500 MHz. For sake of convenience, signal source 318 is modeled and discussed in terms of a modulated local oscillator (LO). As will be described in more detail below, modulated signal source 318 may be implemented in a number of ways, including a direct digital synthesizer (DDS) and a sigma-delta synthesizer.

In one implementation, for both GSM and DCS operation, down converter 316 operates in "high side injection" mode. That is, the frequency of the modulated LO signal ($f_{LO}$), after being multiplied by a factor K (block 320), is higher than that of the transmit signal ($f_{Tx}$) The IF frequency of the signal produced by down converter 316 is expressed as:

$$f_{IF} = K \cdot f_{LO} - f_{Tx} \quad \text{(equation 1)}.$$

Though high side injection for both GSM and DCS operation is envisioned, in some instances, it might be desirable to use low side injection. If low side injection is used, the IF frequency of the signal produced by down converter 316 would be expressed as:

$$f_{IF} = f_{Tx} - K \cdot f_{LO} \quad \text{(equation 2)}.$$

As indicated above, the modulated LO signal is multiplied by a factor K at multiplier 320 before it is supplied to down converter 316. K is an integer frequency multiplication factor and is typically in the range of 1–4. In one implementation, K is 2 for GSM operation and 4 for DCS operation. The design and configuration of multipliers is well known to those of ordinary skill in the art. Multiplier 320 may be implemented, for example, through a combination of harmonic mixing and an X2 frequency multiplier (for DCS). Multiplier 320 may not be required in every implementation of transmitter 300. If a multiplier is not used, K would simply have a value of one in the equations set forth in this description.

The IF signal generated by mixer 316 is passed through low pass filter 314. Low pass filter 314 limits the maximum frequency of the IF signal and attenuates any high frequency spurs or mixing products. Phase detector 302 compares the phases of the IF and LO signals. Before comparison by detector 302, the IF and LO signal frequencies are divided down to a reference or comparison frequency $f_{CF}$. Divider 310 divides the LO signal frequency $f_{LO}$ by an integer M to generate the comparison frequency $f_{CF}$, and divider 312 divides the IF signal frequency $f_{IF}$ by an integer N to generate the comparison frequency $f_{CF}$. Dividers 310 and 312 may be implemented using counters, shift registers, or through other methods familiar to those of ordinary skill in the art. M is an integer division ratio typically in the range of 5–15, and N is an integer division ratio typically in the range of 1–5.

The frequency relationship between $f_{LO}$ and $f_{IF}$ can be expressed as:

$$f_{CF} = \frac{f_{LO}}{M} = \frac{f_{IF}}{N}. \quad \text{(equation 3)}$$

Substituting equations 1 and 2 into equation 3 yields:

$$\frac{f_{LO}}{M} = \frac{K \cdot f_{LO} - f_{Tx}}{N} \text{(equation 4; high side injection); and}$$

$$\frac{f_{LO}}{M} = \frac{f_{Tx} - K \cdot f_{LO}}{N} \text{(equation 5; low side injection).}$$

Solving for $f_{LO}$ demonstrates a fixed relationship between the transmit frequency and the LO frequency:

$$f_{LO} = f_{Tx}\left(\frac{M}{KM-N}\right) \text{(equation 6; high side injection); and}$$

$$f_{LO} = f_{Tx}\left(\frac{M}{KM+N}\right) \text{(equation 7; low side injection).}$$

Equations 6 and 7 are easily solved for $f_{Tx}$:

$$f_{Tx} = f_{LO}\left(\frac{KM-N}{M}\right) \text{(equation 8; high side injection); and}$$

$$f_{Tx} = f_{LO}\left(\frac{KM+N}{M}\right) \text{(equation 9; low side injection).}$$

Equations 8 and 9 demonstrate that the transmit channel can be programmed in discrete steps by changing either the LO frequency or the N, M and/or the K values. In a preferred implementation, the transmit channel is programmed by adjusting the LO frequency. If there is leakage of the local oscillator signal into the phase detector, or vice-versa, any spurious mixing products generated will land either exactly on zero or at a frequency that is a multiple of the lowest of the two frequencies. Hence, no low frequency "zero-crossing" spurs are generated that might slip through the filters without being attenuated.

Based on the comparison of the signal phases, phase detector 302 generates an appropriate output signal. If the phases of the two signals are aligned, the loop is "locked". No adjustment voltage is asserted and VCO 308 continues to oscillate at the same frequency. If one signal leads or lags the other, phase detector 302 outputs a pulse proportional to the phase difference between the two signals. The output pulses are commonly referred to as "UP" or "DOWN" signals and typically have a width or duration proportional to the phase difference between the detector input signals.

Charge pump 304, based on the signal received from detector 302, generates a current that adjusts the transmit frequency of VCO 308. The charge pump current is increased or decreased as necessary to correct phase leads or lags. If the loop is locked, the charge pump current is neither increased nor decreased. Loop filter 306 develops a control voltage from the charge pump current and applies it to VCO 308. A common configuration for a loop filter is a simple single-pole, low-pass filter that can be realized with a single resistor and capacitor. VCO 308 oscillates about a specific transmit frequency channel that is adjusted as necessary by the control voltage applied by loop filter 306. In GSM, the bandwidth of each transmit frequency channel is 200 kHz.

Figure 9:
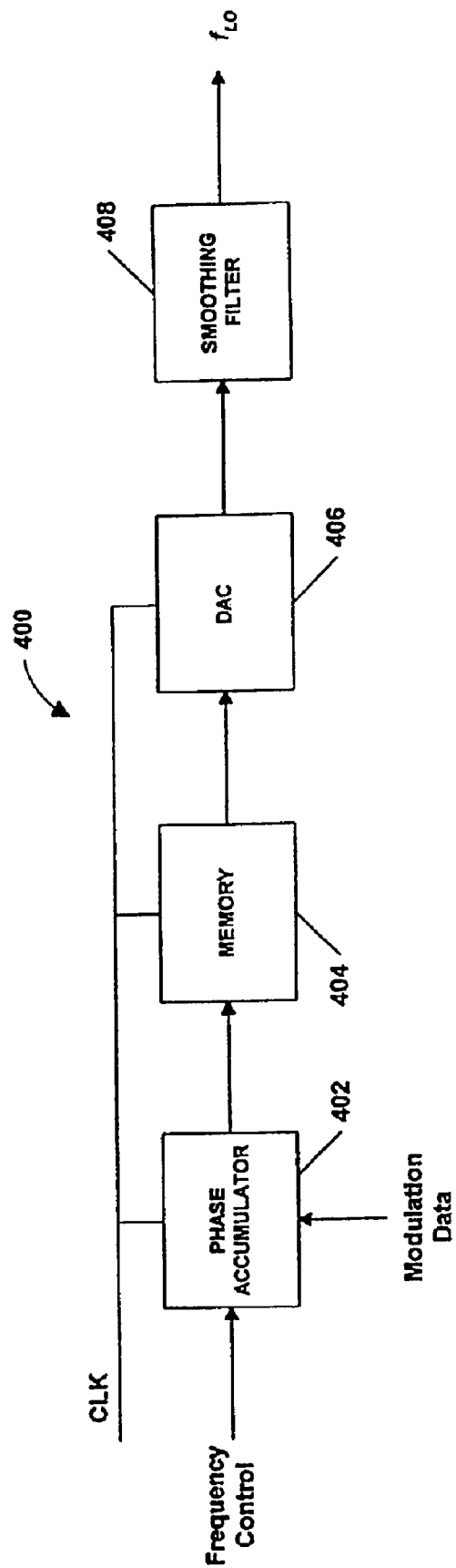
FIG. 9 is a block diagram of an exemplary direct digital synthesizer.

As noted above, the modulated LO signal may be generated in a number of ways. Exemplary devices for generating the modulated LO signal include, but are not limited to, a direct digital synthesizer (DDS), a sigma-delta modulator, a quadrature modulator, a conventional PLL with a modulated reference, and a conventional PLL with a modulating signal added to the VCO control voltage. Each of these devices is familiar to those of ordinary skill in the art, and their operation need not be described herein. For illustrative purposes, however, a basic DDS 400 is illustrated in block form in FIG. 9. DDS 400 includes a phase accumulator 402, memory 404, digital-to-analog converter (DAC) 406 and smoothing filter 408. A fixed reference clock (CLK) clocks accumulator 402, memory 404 and DAC 406.

Phase accumulator 402 receives a frequency control input and a modulation data input. The frequency control inputs dictates the frequency $f_{LO}$ of the DDS output signal. The modulation data input is typically just a phase value. Although I/Q values contain both amplitude and phase information, the translation loop cannot translate amplitude modulation. This is suitable, however, since GSM modulation (typically Gaussian Minimum Shift Keying, or GMSK) is based on pure phase modulation (no AM component). Based on the frequency and modulation data inputs, a phase increment value is generated. On each clock pulse, the phase increment value is added to the previous accumulator output. Hence, the phase values that are output by accumulator 402 steadily increase to create a phase ramp.

Memory 404 stores sine wave amplitude values corresponding to the phase values output by accumulator 402. Memory 404 is usually implemented as a ROM lookup table that converts phase values to sine wave amplitudes. The output of memory 404 is discrete amplitude values of the desired sine wave. DAC 406 converts the digitized sine wave amplitude values to analog amplitude values. Smoothing filter 408 smoothes the DAC output, which is usually in the form of small steps, into a smooth sine waveform.

The modulated output from smoothing filter 408 is the modulated LO signal, having a frequency $f_{LO}$, that is supplied to mixer 316 and divider 310 of transmitter 300 (FIG. 8).

The present invention is superior in terms of power consumption to a system in which a modulated signal is generated directly at the transmit frequency. In a direct modulation architecture, the frequency synthesizer would be required to operate at a higher frequency and thereby use more power. Moreover, the requirements for the transmit VCO and receive VCO are different and, in the case of a TDMA system (e.g., GSM), it is desirable to have a separate transmit VCO and receive VCO. This allows the transmit VCO to be shut down during receive mode to conserve power. Furthermore, use of a separate transmit VCO eliminates the necessity for switching VCOs in the modulating synthesizer.

Figure 10:
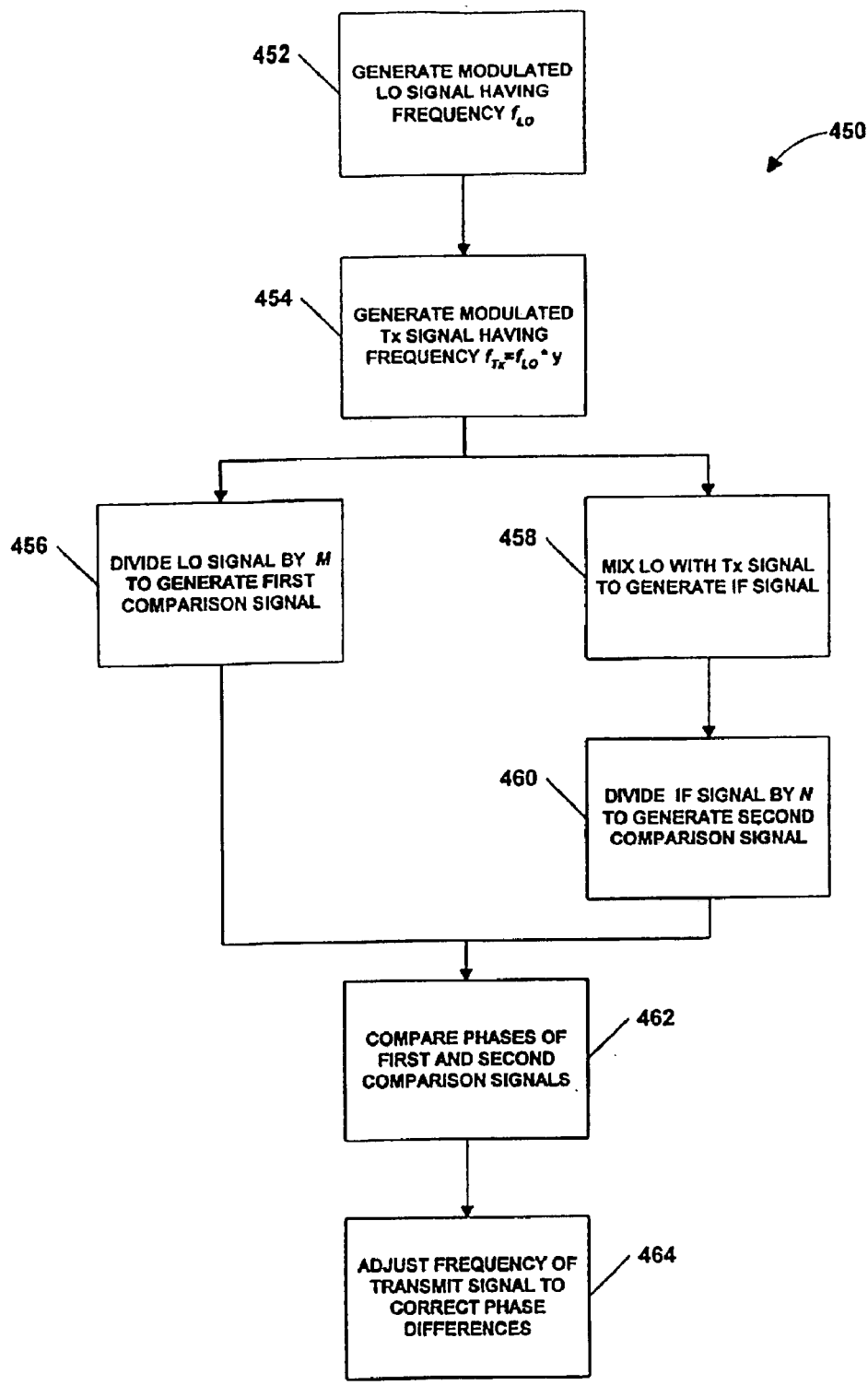
FIG. 10 is a flowchart illustrating a method for transmitting a modulated transmit signal according to the present invention.

FIG. 10 depicts a method 450 for transmitting a modulated transmit signal according to the present invention. In step 452, a modulated LO signal having a frequency $f_{Lo}$ is generated. As described above, the LO signal is modulated with information such as baseband I and Q signals, and may be generated in a number of ways. In step 454, a modulated transmit signal is generated having a frequency $f_{Tx}=f_{LO} \cdot y$ In one implementation, where $$f_{LO} > f_{Tx}, y = \frac{MK - N}{M}$$

(high side injection); and where $$f_{LO} < f_{Tx}, y = \frac{MK + N}{M}$$

(low side injection).

In steps 456 and 458–460 the LO signal is used both to generate a reference (first comparison) signal and to generate an IF signal. In step 456, the frequency $f_{LO}$ of the LO signal is divided by an integer M to generate the reference (first comparison) signal. In one implementation, before mixing the LO and transmit signal, the LO signal is multiplied by an integer K. In step 458, the LO signal is mixed with the transmit signal to generate an IF signal. In step 460, the IF signal is divided by an integer N to generate a second comparison signal. Steps 456 and 458–460 may be performed in any order or simultaneously. In step 462, the phases of the first and second comparison signal are compared to detect any phase differences. If a phase difference exists, the frequency of the transmit signal is adjusted to correct the phase difference (step 464).

Figure 11:
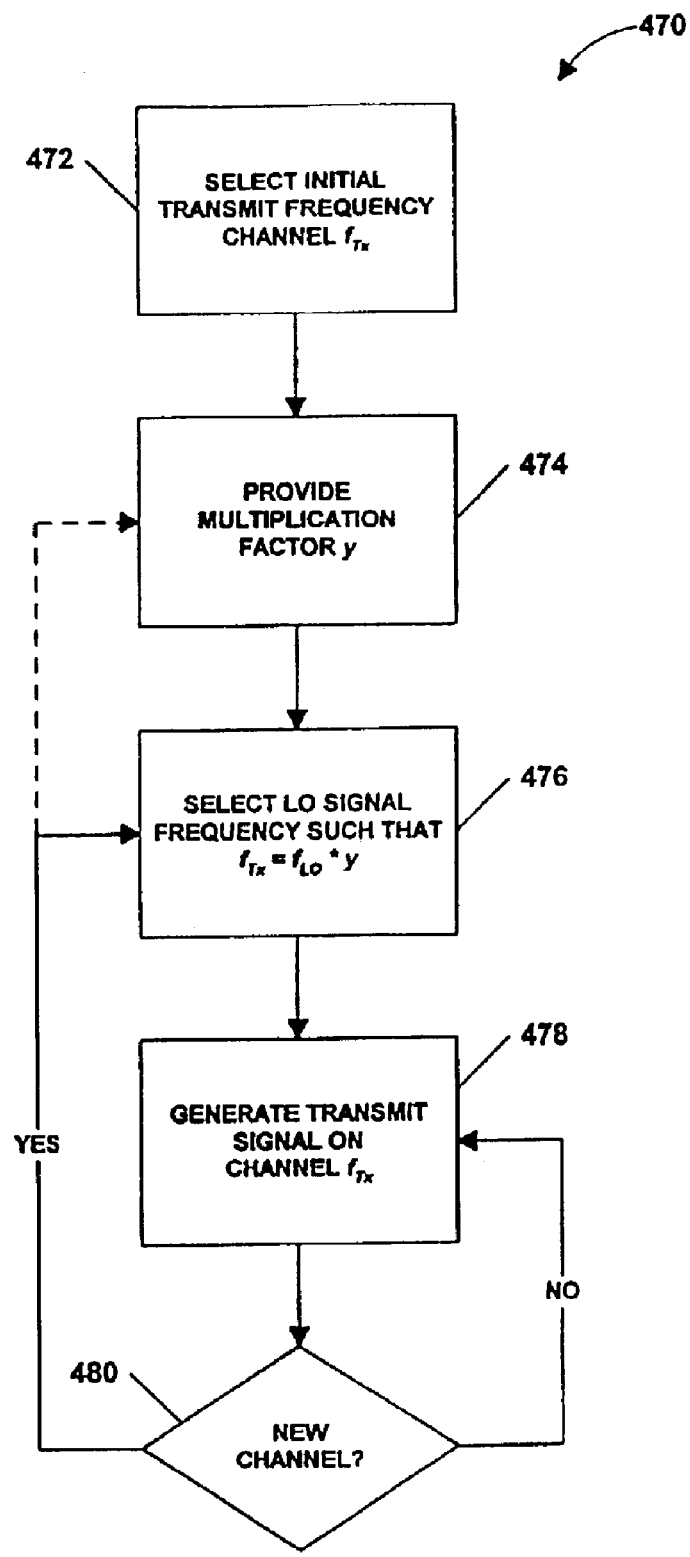
FIG. 11 is a flowchart illustrating a method for setting a transmit frequency channel according to the present invention.

FIG. 11 depicts a method 470 according to the present invention for setting a transmit frequency channel. In step 472 an initial transmit frequency channel $f_{Tx}$ is selected. In step 474, a multiplication factor y is provided. In one implementation, where $$f_{LO} > f_{Tx}, y = \frac{MK - N}{M}$$

(high side injection); and where $$f_{LO} < f_{Tx}, y = \frac{MK + N}{M}$$

(low side injection). If a K factor is not used, it is simply replaced with one in the above equations.

In step 476, an LO signal frequency is selected such that the desired transmit frequency channel is obtained by multiplying the LO signal frequency by the multiplication factor y, or $f_{Tx}=f_{LO} \cdot y$. In step 478, the transmit signal on the frequency channel $f_{Tx}=f_{LO} \cdot y$ is generated. At decision node 480, it is determined whether a new frequency channel is necessary. If no new channel is necessary, the transmit signal continues to be generated on the same frequency channel. If a new channel is necessary, in a preferred implementation, the method returns to step 476 to reset the LO frequency to yield the new frequency channel. Alternatively, as indicated by the dashed line leading to step 474, the multiplication factor y could be changed to yield the new frequency channel. This would involve changing the M, N and/or K factors. In another implementation, both the LO frequency and y factor may be changed to yield the new frequency channel.

While particular embodiments of the present invention have been described above, it should be understood that they have been presented by way of example only, and not as limitations. The breadth and scope of the present invention is defined by the following claims and their equivalents, and is not limited by the particular embodiments described herein.

What is claimed is:

1. A transmitter comprising:
   a voltage-controlled oscillator (VCO) that generates a transmit signal having a frequency $f_{Tx}$;
   a modulated signal source that generates an LO signal modulated with audio or data information, the modulated signal having a frequency $f_{LO}$;
   a mixer that mixes the transmit signal with the LO signal to produce an IF signal having a frequency $f_{IF}$;
   a first divider that divides the LO signal frequency $f_{LO}$ by an integer M to generate a first comparison signal having a frequency $f_{CF}$;
   a second divider that divides the IF signal frequency $f_{IF}$ by an integer N to generate a second comparison signal having a frequency $f_{CF}$;
   a phase detector coupled to the first and second comparison signals that compares the phases of the signals and outputs a control voltage to the VCO proportional to any phase differences between the signals;
   a multiplier that multiplies the LO signal by an integer K before the LO signal is supplied to the mixer; and
   wherein when $f_{LO} > f_{Tx}$, the relationship between the transmit and LO signal frequency is expressed as $$f_{Tx} = f_{LO} \frac{KM - N}{M},$$

and when $f_{LO} < f_{Tx}$, the relationship between the transmit and LO signal frequency is expressed as $$f_{Tx} = f_{LO} \frac{KM + N}{M}.$$

2. A transmitter as claimed in claim 1, wherein the modulated signal source is a direct digital synthesizer (DDS).

3. A transmitter as claimed in claim 1, wherein the modulated signal source is a sigma-delta synthesizer.

4. A transmitter as claimed in claim 1, wherein M is in the range of 5–15, N is in the range of 1–5, and K is in the range of 1–4.

5. A transmitter as claimed in claim 1, and further comprising a low pass filter that is coupled between the mixer and the second divider to attenuate high frequency spurs and mixing products.

6. A transmitter as claimed in claim 1, and further comprising a charge pump coupled to the phase detector that generates a control current based on the control voltage output by the phase detector, and a loop filter that receives the control current and develops a control signal that is applied to the VCO.

7. A wireless communication system in which a geographical area is divided into a plurality of cells, and a base station is provided within each of the cells for serving mobile wireless communication devices within the cell, wherein at least one of the mobile communication devices within the system incorporates a transmitter comprising:
   a voltage-controlled oscillator (VCO) that generates a transmit signal having a frequency $f_{Tx}$;
   a modulated signal source that generates an LO signal modulated with audio or data information, the modulated signal having a frequency $f_{LO}$;
   a mixer that mixes the transmit signal with the LO signal to produce an IF signal having a frequency $f_{IF}$;
   a first divider that divides the LO signal frequency $f_{LO}$ by an integer M to generate a first comparison signal having a frequency $f_{CF}$;
   a second divider that divides the IF signal frequency $f_{IF}$ by an integer N to generate a second comparison signal having a frequency $f_{CF}$;
   a phase detector coupled to the first and second comparison signals that compares the phases of the signals and outputs a control voltage to the VCO proportional to any phase differences between the signals;
   a multiplier that multiplies the LO signal by an integer K before the LO signal is supplied to the mixer; and
   wherein when $f_{LO} > f_{Tx}$, the relationship between the transmit and LO signal frequency is expressed as $$f_{Tx} = f_{LO} \frac{KM - N}{M},$$

and when $f_{LO} < f_{Tx}$, the relationship between the transmit and LO signal frequency is expressed as $$f_{Tx} = f_{LO} \frac{KM + N}{M}.$$

8. A wireless communication system in which a geographical area is divided into a plurality of cells, and a base station is provided within each of the cells for serving wireless communication devices, wherein at least one of the mobile communication devices within the system incorporates a transmitter comprising:
   a voltage-controlled oscillator (VCO) that generates a transmit signal having a frequency $f_{Tx}$;
   a modulated signal source that generates an LO signal modulated with audio or data information, the modulated signal having a frequency $f_{LO}$;
   a mixer that mixes the transmit signal with the LO signal to produce an IF signal having a frequency $f_{IF}$;
   a first divider that divides the LO signal frequency $f_{LO}$ by an integer M to generate a first comparison signal having a frequency $f_{CF}$;
   a second divider that divides the IF signal frequency $f_{IF}$ by an integer N to generate a second comparison signal having a frequency $f_{CF}$;
   a phase detector coupled to the first and second comparison signals that compares the phases of the signals and outputs a control voltage to the VCO proportional to any phase differences between the signals;
   a multiplier that multiplies the LO signal by an integer K before the LO signal is supplied to the mixer; and
   wherein when $f_{LO} > f_{Tx}$, the relationship between the transmit and LO signal frequency is expressed as $$f_{Tx} = f_{LO} \frac{KM - N}{M},$$

and when $f_{LO} < f_{Tx}$, the relationship between the transmit and LO signal frequency is expressed as $$f_{Tx} = f_{LO} \frac{KM + N}{M}.$$

9. A wireless communication device comprising:
   a processor that directs the overall operation of the communication device;

a microphone for capturing audio acoustic signals and converting the acoustic signals into electric signals;

a speaker for converting electric signals into audible acoustic signals;

an antenna for wireless transmission and reception of acoustic or data signals;

a receiver for receiving audio or data information from the antenna; and a transmitter for transmitting audio or data information over the antenna, wherein the transmitter has a modified translation loop architecture and comprises:

a voltage-controlled oscillator (VCO) that generates a transmit signal having a frequency $f_{Tx}$;

a modulated signal source that generates an LO signal having a frequency $f_{LO}$ that is modulated with audio or data information;

a mixer that mixes the transmit signal with the LO signal to produce an IF signal having a frequency $f_{IF}$, a first divider that divides the LO signal frequency $f_{LO}$ by an integer M to generate a first comparison signal having a frequency $f_{CF}$, a second divider that divides the IF signal frequency $f_{IF}$ by an integer N to generate a second comparison signal having a frequency $f_{CF}$;

a phase detector coupled to the first and second comparison signals that compares the phases of the signals and outputs a control voltage to the VCO proportional to any phase differences between the signals;

a multiplier that multiplies the LO signal by an integer K before the LO signal is supplied to the mixer; and wherein when $f_{LO} > f_{Tx}$, the relationship between the transmit and LO signal frequency is expressed as $$f_{Tx} = f_{LO} \frac{KM - N}{M},$$

and when $f_{LO} < f_{Tx}$, the relationship between the transmit and LO signal frequency is expressed as $$f_{Tx} = f_{LO} \frac{KM + N}{M}.$$

10. A method for transmitting a modulated signal comprising the following steps:

(a) generating a modulated LO signal having a frequency $f_{LO}$;

(b) generating a modulated transmit signal having a frequency $f_{Tx} = f_{LO}$ y, when $$f_{LO} > f_{Tx}, y = \frac{M - N}{M},$$

and when $$f_{LO} < f_{Tx}, y = \frac{M + N}{M}.$$

(c) dividing the frequency $f_{LO}$ of the LO signal by an integer M to generate a first comparison signal;

(d) mixing the LO signal with the transmit signal to generate an IF signal;

(e) dividing the frequency of the IF signal by an integer N to generate a second comparison signal;

(f) comparing the phases of the first and second comparison signals; and (g) adjusting the frequency $f_{Tx}$, of the transmit signal if necessary to correct any detected phase differences between the first and second comparison signals.

11. A method as claimed in claim 10, wherein in step (a), the LO signal is generated by a DDS or by a sigma-delta synthesizer.

12. A method as claimed in claim 10, and comprising the additional step of multiplying the LO signal by an integer K before it is mixed with the transmit signal.

* * * * *